US010964239B2

(12) United States Patent
Cho et al.

(10) Patent No.: US 10,964,239 B2
(45) Date of Patent: Mar. 30, 2021

(54) LIGHTING TEST DEVICE, LIGHTING TEST METHOD, AND LIGHTING TEST SYSTEM

(71) Applicant: Samsung Display Co., Ltd., Yongin-Si (KR)

(72) Inventors: Daeyoun Cho, Yongin-si (KR); Sangkil Kim, Seongnam-si (KR); Hyunho Kim, Cheonan-si (KR); Young-joo Noh, Asan-si (KR); Jongwoo Park, Seongnam-si (KR); Jongwon Lee, Seongnam-si (KR); Juhee Lee, Asan-si (KR); Youngtae Choi, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 49 days.

(21) Appl. No.: 16/391,802

(22) Filed: Apr. 23, 2019

(65) Prior Publication Data

US 2019/0392741 A1 Dec. 26, 2019

(30) Foreign Application Priority Data

Jun. 22, 2018 (KR) ........................ 10-2018-0072297

(51) Int. Cl.
*G01R 31/02* (2006.01)
*G09G 3/00* (2006.01)
*G09G 3/3225* (2016.01)

(52) U.S. Cl.
CPC ........... *G09G 3/006* (2013.01); *G09G 3/3225* (2013.01); *G09G 2330/10* (2013.01)

(58) Field of Classification Search
CPC ........... G01R 31/2822; G01R 31/2825; G01R 31/2884; G01R 31/2886; G01R 31/2889; G01R 31/3025; G01R 31/31723; G01R 31/3641; G01R 29/0814; G01R 31/0878; G01R 29/26; G09G 3/006; G09G 3/3225; G09G 2330/06; G09G 2330/028; G09G 2330/10; G09G 2330/12; G02F 1/0121; G02F 1/1309; G02F 1/13452
See application file for complete search history.

(56) References Cited

U.S. PATENT DOCUMENTS 8,054,005 B2 * 11/2011 Tonomura ............ G09G 3/3648 315/291
9,389,245 B2 * 7/2016 Peng ........................ G01R 1/20
9,595,213 B2 3/2017 Kim
(Continued)

FOREIGN PATENT DOCUMENTS

KR 1020140113469 A 9/2014
KR 101510386 B1 4/2015

*Primary Examiner* — Thang X Le
(74) *Attorney, Agent, or Firm* — Cantor Colburn LLP

(57) ABSTRACT

A lighting test device for a display panel includes: a connection part including a first connection test pad, a second connection test pad and a plurality of test pads, which are arranged at an end of the connection part, where the connection part is allowed to be connected to the display panel through the first connection test pad, the second connection test pad and the test pads; and a test circuit which outputs a connection test signal to the first connection test pad, receives a feedback signal through the second connection test pad, and adjusts voltage levels of test signals to be applied to the test pads based on the connection test signal and the feedback signal.

20 Claims, 11 Drawing Sheets

(56) References Cited

U.S. PATENT DOCUMENTS

| | | | | |
|---|---|---|---|---|
| 2008/0238442 | A1* | 10/2008 | Ryu | G09G 3/006 324/629 |
| 2008/0284461 | A1* | 11/2008 | Gebara | G01R 31/3004 324/750.3 |
| 2014/0266244 | A1* | 9/2014 | Minaev | G09G 3/006 324/537 |
| 2017/0205956 | A1* | 7/2017 | Li | G06F 3/0412 |

* cited by examiner

LIGHTING TEST DEVICE, LIGHTING TEST METHOD, AND LIGHTING TEST SYSTEM

This application claims priority to Korean Patent Application No. 10-2018-0072297, filed on Jun. 22, 2018, and all the benefits accruing therefrom under 35 U.S.C. § 119, the content of which in its entirety is herein incorporated by reference.

BACKGROUND

1. Field

The disclosure relates to a lighting test device, a lighting test method of checking whether a display panel normally emits light, and a lighting test system including the lighting test device.

2. Description of the Related Art

An organic light emitting display device typically displays an image using an organic light emitting diode that is self-emissive and has been spotlighted as a next-generation device due to its superior brightness and color purity. A display panel of the organic light emitting display device may include red pixels, green pixels and blue pixels, and may display various color images through the red, green and blue pixels.

Before connecting the display panel to driving circuits in a manufacturing process of the organic light emitting display device, a lighting test is desired to test a lighting state of the red, green and blue pixels arranged in the display panel using a lighting test device.

SUMMARY

The disclosure provides a lighting test device for testing a lighting state of a display panel.

The disclosure provides a lighting test method for the display panel.

The disclosure provides a lighting test system for the display panel.

According to an embodiment of the invention, a lighting test device includes: a connection part including a first connection test pad, a second connection test pad and a plurality of test pads, which are arranged at an end of the connection part, where the connection part is allowed to be connected to a display panel through the first connection test pad, the second connection test pad and the test pads; and a test circuit which outputs a connection test signal to the first connection test pad, receives a feedback signal through the second connection test pad, and adjusts voltage levels of test signals to be applied to the test pads based on the connection test signal and the feedback signal.

In an embodiment, the test circuit may include a test signal generation circuit which generates the connection test signal, a voltage sensing circuit which receives the feedback signal through the second connection test pad, senses a voltage level of the feedback signal and outputs a sensing voltage signal based on the voltage level of the feedback signal, and a compensation circuit which adjusts the voltage levels of the test signals to be applied to the test pads based on the connection test signal and the sensing voltage signal.

In an embodiment, the test circuit may further include a resistor connected between a signal line, which receives the feedback signal, and a ground voltage.

In an embodiment, the resistor may be a variable resistor, and the voltage sensing circuit may apply a resistance variable signal to the variable resistor to vary a resistance value of the variable resistor.

In an embodiment, the connection part may further include a third connection test pad and a fourth connection test pad, which are to be connected to the display panel.

In an embodiment, the test circuit may further output another connection test signal to the third connection test pad, further receive another feedback signal through the fourth connection test pad, and adjust the voltage levels of the test signals to be applied to the test pads based on the connection test signal, the another connection test signal, the feedback signal and the another feedback signal.

In an embodiment, the connection part may further include a signal line arranged on the connection part to electrically connect the third connection test pad and the fourth connection test pad.

In an embodiment, the test circuit may increase the voltage levels of the test signals to be applied to the test pads by a predetermined rate when a difference in voltage between the connection test signal and the feedback signal and a difference in voltage between the another connection test signal and the another feedback signal are greater than a reference value.

In an embodiment, the connection part may include a flexible printed circuit board.

According to another embodiment of the invention, a lighting test method for a lighting test device, including a first connection test pad, a second connection test pad and a plurality of test pads, includes outputting a connection test signal to the first connection test pad, receiving a feedback signal from the second connection test pad, and adjusting voltage levels of test signals to be applied to the test pads based on the connection test signal and the feedback signal.

In an embodiment, the lighting test device may further include a resistor connected between a signal line, which receives the feedback signal, and a ground voltage.

In an embodiment, the method may further include varying a resistance value of the resistor, where the resistor is a variable resistor.

In an embodiment, the lighting test device may further include a third connection test pad and a fourth connection test pad, and the method may further include outputting another connection test signal to the third connection test pad, receiving another feedback signal from the fourth connection test pad, where the adjusting the voltage levels of the test signals to be applied to the test pads may include adjusting the voltage levels of the test signals to be applied to the test pads based on the connection test signal, the another connection test signal, the feedback signal and the another feedback signal.

In an embodiment, the adjusting the voltage level of the test signals to be applied to the test pads may include increasing the voltage levels of the test signals to be applied to the test pads by a predetermined rate when a difference in voltage between the connection test signal and the feedback signal and a difference in voltage between the another connection test signal and the another feedback signal are greater than a reference value.

According to another embodiment of the invention, a lighting test system includes: a display panel including a display area, in which a plurality of pixels is arranged, and a non-display area; and a lighting test device which tests a lighting state of the pixels of the display panel. In such an embodiment, the lighting test device includes: a connection part including a first connection test pad, a second connection test pad and a plurality of test pads, which are arranged at an end of the connection part, where the connection part is allowed to be connected to the display panel through the first connection test pad, the second connection test pad and the test pads; and a test circuit which outputs a connection test signal to the first connection test pad, receives a feedback signal through the second connection test pad, and adjusts voltage levels of test signals to be applied to the test pads based on the connection test signal and the feedback signal. In such an embodiment, the display panel includes: a first connection pad, a second connection pad and a plurality of pads, which are arranged at an end of the non-display area and connected to the first connection test pad, the second connection test pad and the test pads, respectively; and a test signal line arranged in the non-display area to electrically connect the first connection pad and the second connection pad.

In an embodiment, the test signal line may be disposed to surround the display area outside the display area.

In an embodiment, the test circuit includes: a test signal generation circuit which generates the connection test signal, a voltage sensing circuit which receives the feedback signal through the second connection test pad, senses a voltage level of the feedback signal, and outputs a sensing voltage signal based on the voltage level of the feedback signal; and a compensation circuit which adjusts the voltage levels of the test signals to be applied to the test pads based on the connection test signal and the sensing voltage signal.

In an embodiment, the test circuit may further include a resistor connected between a signal line, which receives the feedback signal, and a ground voltage.

In an embodiment, the resistor may be a variable resistor, and the voltage sensing circuit may apply a resistance variable signal to the variable resistor to vary a resistance value of the variable resistor.

In an embodiment, the connection part may further include a third connection test pad and a fourth connection test pad, which are connected to the display panel, and the test circuit may output another connection test signal to the third connection test pad, receive another feedback signal through the fourth connection test pad, and adjust the voltage levels of the test signals to be applied to the test pads based on the connection test signal, the another connection test signal, the feedback signal and the another feedback signal.

In an embodiment, the connection part may further include a signal line arranged on the connection part to electrically connect the third connection test pad and the fourth connection test pad.

According to embodiments set forth herein, the lighting test device may adjust the voltage levels of the test signals depending on the connection state between the pads of the display panel and the test pads of the lighting test device. Accordingly, in such embodiments, the distortion of the test result, which is caused by the connection state between the pads of the display panel and the test pads of the lighting test device, may be substantially reduced or effectively prevented.

BRIEF DESCRIPTION OF THE DRAWINGS

The above and other features of the disclosure will become readily apparent by reference to the following detailed description when considered in conjunction with the accompanying drawings, in which.

DETAILED DESCRIPTION

Figure 1:
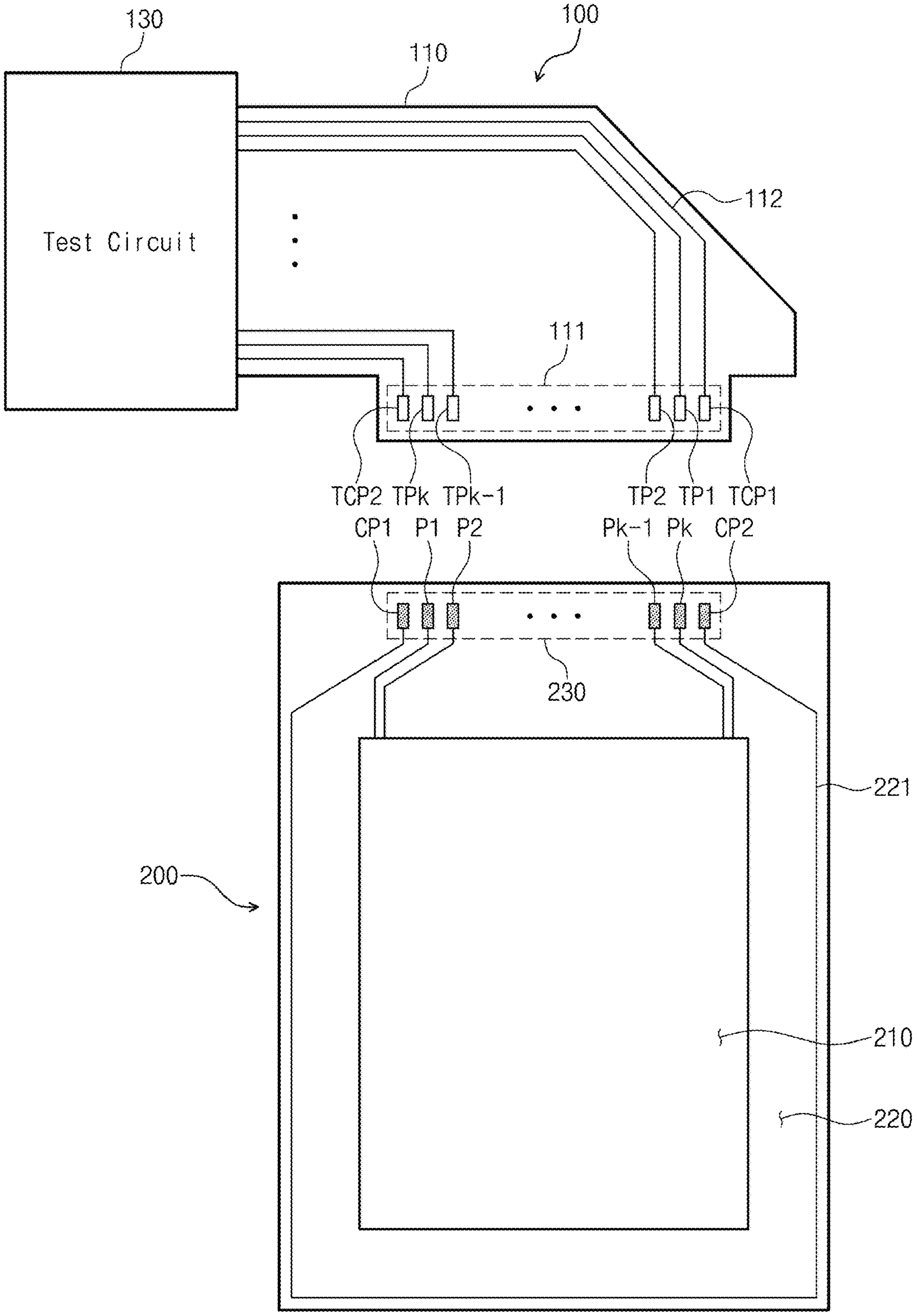
FIG. 1 is a view showing a lighting test device and a display panel according to an exemplary embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element or layer is referred to as being "on", "connected to" or "coupled to" another element or layer, it can be directly on, connected or coupled to the other element or layer or intervening elements or layers may be present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least A and B" means "A or B." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein should be interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the invention will be described in detail with reference to the accompanying drawings.

FIG. 1 is a view showing a lighting test device 100 and a display panel 200 according to an exemplary embodiment of the disclosure.

Referring to FIG. 1, the lighting test device 100 according to an exemplary embodiment is used to test a lighting state of the display panel 200. In such an embodiment, the lighting test device 100 includes a connection part 110 and a test circuit 130.

The connection part 110 may be implemented by a flexible printed circuit board ("FPCB"), on which a plurality of signal lines 112 is arranged, and the connection part 110 may include a pad part 111 at one end thereof. A first connection test pad TCP1, a second connection test pad TCP2 and a plurality of test pads TP1 to TPk are arranged in the pad part 111. In an exemplary embodiment, as shown in FIG. 1, the test pads TP1 to TPk are arranged in a center portion of the pad part 111, and the first connection test pad TCP1 and the second connection test pad TCP2 are arranged at both ends of the pad part 111, respectively, such that the test pads TP1 to TPk are arranged between the first and second connection test pads TCP1 and TCP2.

The connection part 110 may be connected to the display panel 200 through the first connection test pad TCP1, the second connection test pad TCP2 and the test pads TP1 to TPk of the pad part 111.

The test circuit 130 outputs a connection test signal to the first connection test pad TCP1 through the connection part 110, receives a feedback signal from the second connection test pad TCP2 through the connection part 110, and adjusts a voltage level of test signals to be applied to the test pads TP1 to TPk based on the connection test signal and the feedback signal. A circuit configuration and an operation of the test circuit 130 will be described later in greater detail.

The display panel 200 includes a display area 210 and a non-display area 220. Although not shown in figures, a plurality of pixels is arranged in the display area 210. Each of the pixels includes, for example, an organic light emitting diode ("OLED"). A display panel pad part 230 connected to the pad part 111 of the connection part 110 is defined in one end of the non-display area 220. The display panel pad part 230 includes a first connection pad CP1, a second connection pad CP2, and a plurality of pads P1 to Pk. The first connection pad CP1 and the second connection pad CP2 are electrically connected to each other through a test signal line 221. The test signal line 221 is arranged on the non-display area 220 to surround the display area 210 outside the display area 210.

Figure 2:
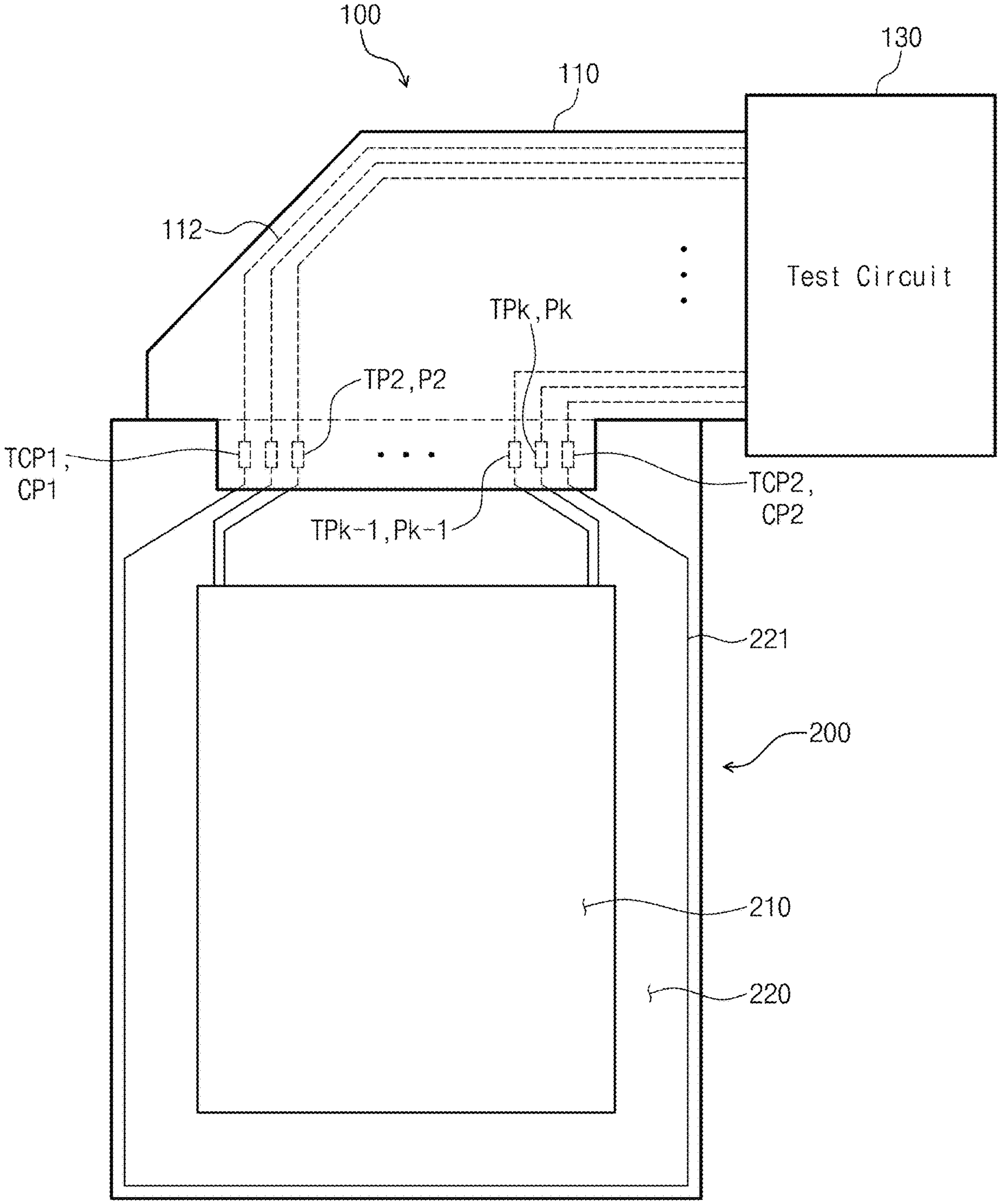
FIGS. 2 to 4 are views showing an exemplary embodiment of the lighting test device and the display panel in a connected state.
Figure 3:
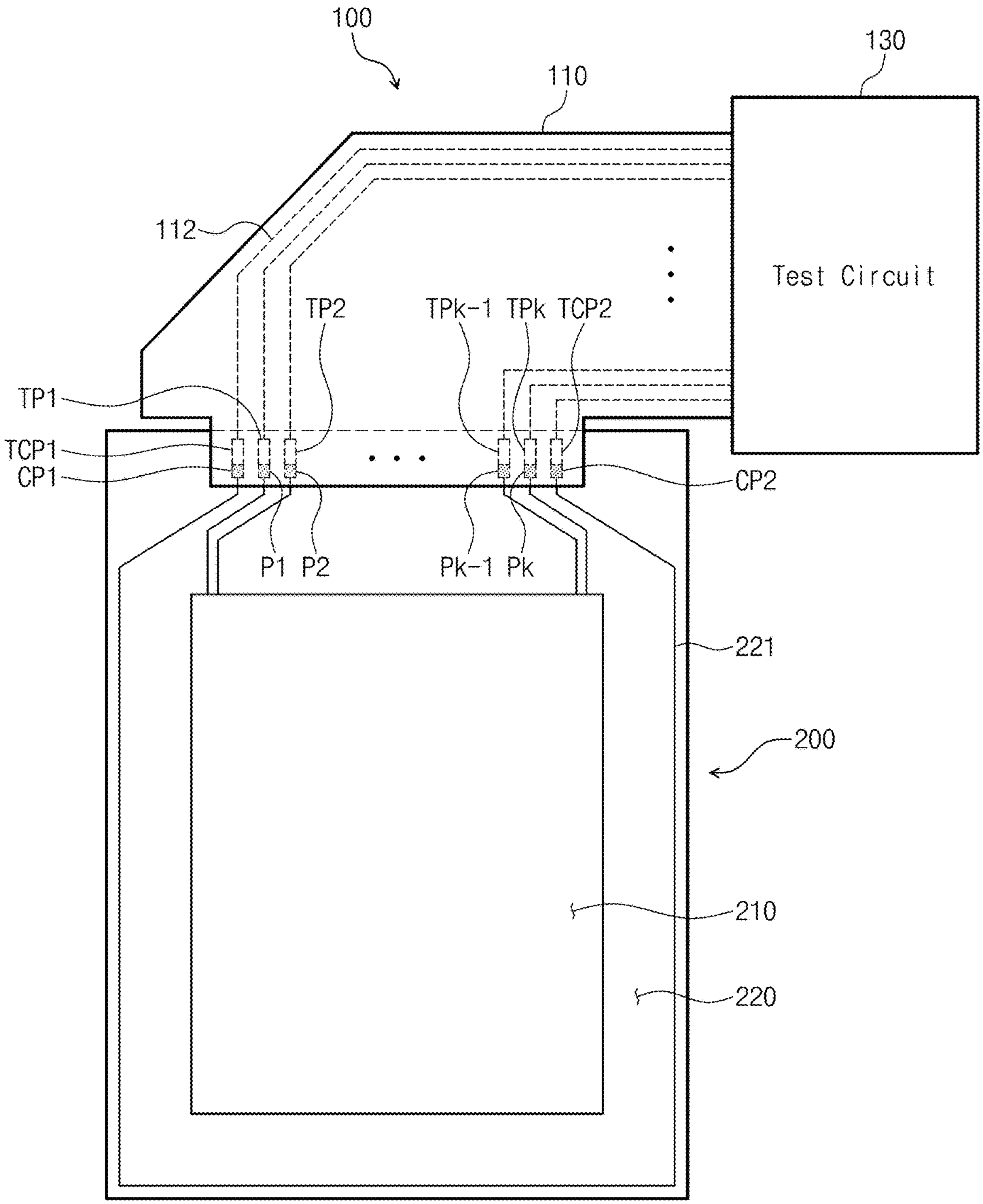
Figure 4:
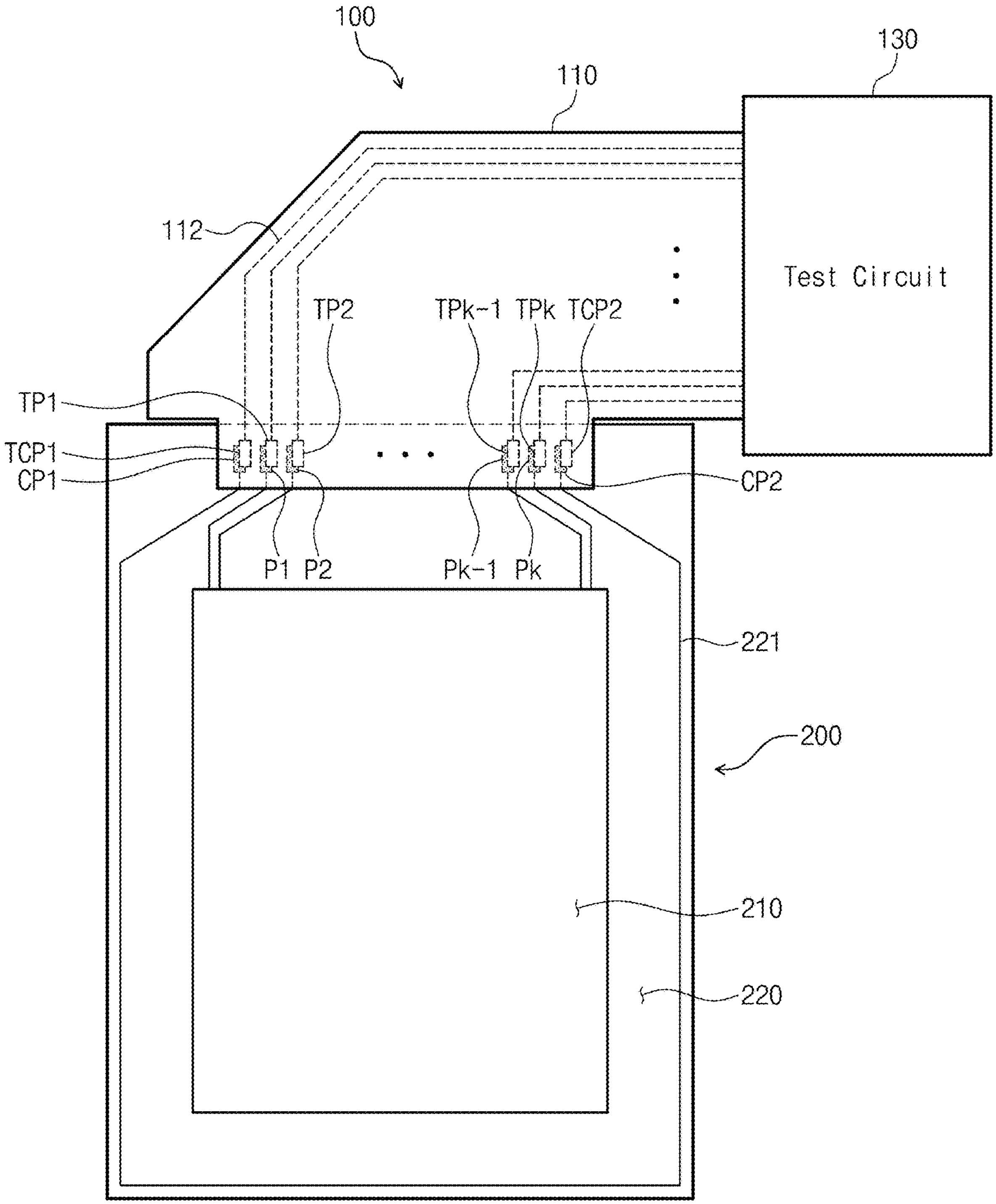

FIGS. 2 to 4 are views showing an exemplary embodiment of the lighting test device 100 and the display panel 200 in a connected state.

Referring to FIG. 2, the first connection test pad TCP1, the second connection test pad TCP2 and the test pads TP1 to TPk, which are arranged on a lower portion of the connection part 110 of the lighting test device 100, are connected to the first connection pad CP1, the second connection pad CP2 and the pads P1 to Pk, respectively.

FIG. 2 shows an exemplary embodiment of the lighting test device 100 and the display panel 200 in a state in which the first connection test pad TCP1, the second connection test pad TCP2 and the test pads TP1 to TPk of the lighting test device 100 are directly connected to the first connection pad CP1, the second connection pad CP2 and the pads P1 to Pk of the display panel 200, respectively. In such an embodiment, the lighting test device 100 may further include a fixing device (not shown) to maintain the connection state between the first connection test pad TCP1, the second connection test pad TCP2 and the test pads TP1 to TPk and the first connection pad CP1, the second connection pad CP2 and the pads P1 to Pk.

In an exemplary embodiment, as shown in FIG. 2, the first connection test pad TCP1, the second connection test pad TCP2 and the test pads TP1 to TPk of the connection part 110 are fully connected to the first connection pad CP1, the second connection pad CP2 and the pads P1 to Pk of the display panel 200 in predetermined locations. In such an embodiment, the test pads TP1 to TPk of the connection part 110 may be substantially fully connected to the pads P1 to Pk of the display panel 200, such that the test signals provided from the test circuit 130 may be applied to the display panel 200 without being distorted.

In such an embodiment, as shown in FIGS. 3 and 4, the first connection test pad TCP1, the second connection test pad TCP2 and the test pads TP1 to TPk of the connection part 110 may be dislocated from the first connection pad CP1, the second connection pad CP2 and the pads P1 to Pk of the display panel 200 by a predetermined distance and are not fully connected to the first connection pad CP1, the second connection pad CP2 and the pads P1 to Pk of the display panel 200.

In such an embodiment, when the first connection test pad TCP1, the second connection test pad TCP2 and the test pads TP1 to TPk of the connection part 110 are dislocated from the first connection pad CP1, the second connection pad CP2 and the pads P1 to Pk, the test signals applied to the display panel 200 from the test circuit 130 may be distorted due to the incomplete connection state between the test pads TP1 to TPk and the pads P1 to Pk. In one exemplary embodiment, for example, when a connection resistance varies due to the incomplete connection state between the test pads TP1 to TPk and the pads P1 to Pk, a difference between the test signals provided from the test circuit 130 and the test signals received at the display panel 200 may occur such that a test result on the display panel 200 may be distorted due to the difference.

When a voltage level of a power supply voltage and a voltage level of data signals are lowered due to the connection difference between the test pads TP1 to TPk and the pads P1 to Pk even though the test circuit 130 of the lighting test device 100 provides the power supply voltage and the data signals with an appropriate voltage level, the pixels arranged in the display panel 200 may be not lit. The lighting error in the pixels is caused by the connection state between the test pads TP1 to TPk and the pads P1 to Pk, however, the pixels arranged in the display panel 200 may be determined as defective due to the lighting error in the pixels.

Figure 5:
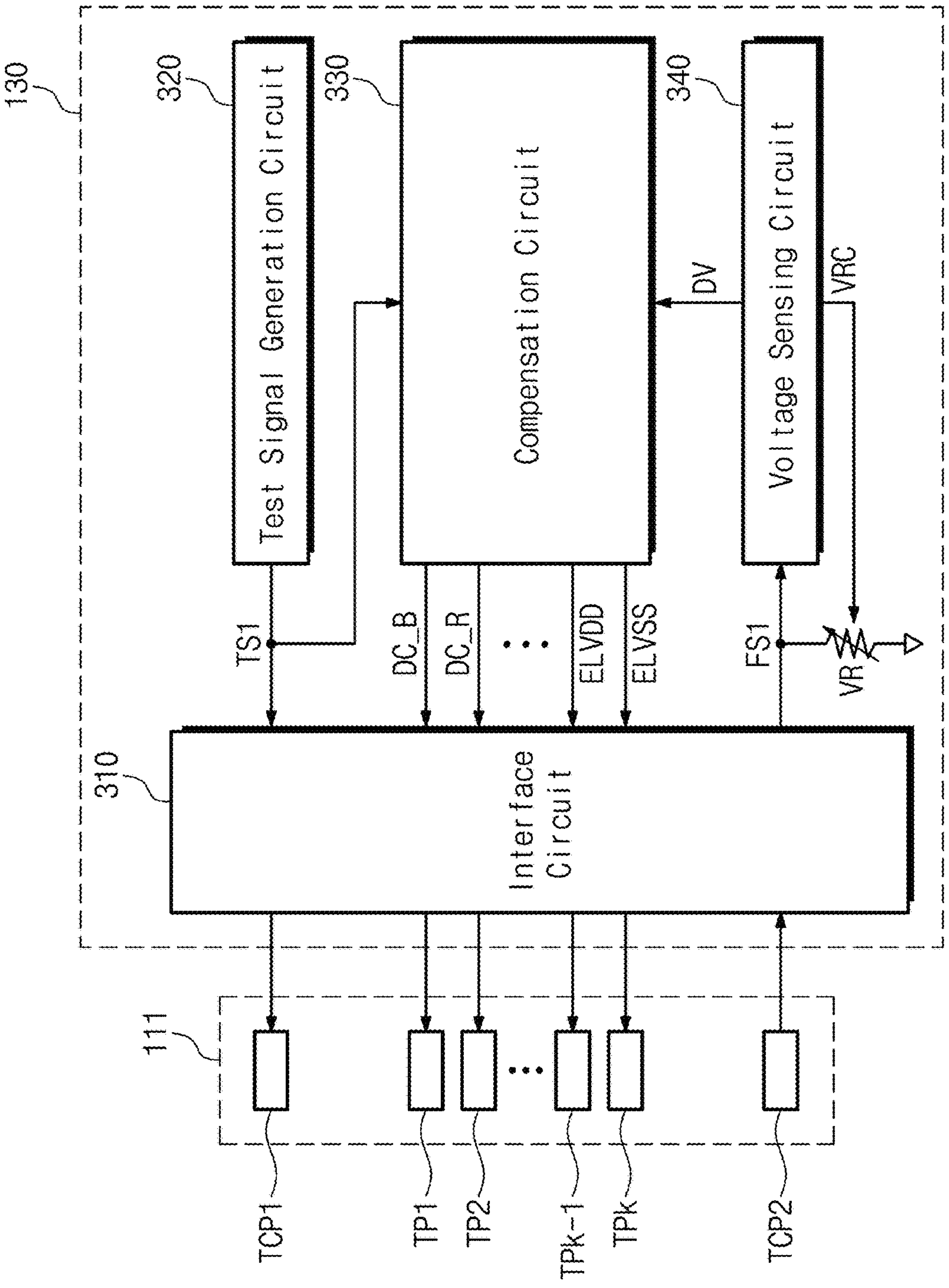
FIG. 5 is a block diagram showing a configuration of a test circuit in a lighting test device according to an exemplary embodiment of the disclosure.

FIG. 5 is a block diagram showing a configuration of the test circuit 130 in the lighting test device 100 according to an exemplary embodiment of the disclosure.

Referring to FIG. 5, the test circuit 130 according to an exemplary embodiment includes an interface circuit 310, a test signal generation circuit 320, a compensation circuit 330, a voltage sensing circuit 340, and a resistor VR.

The interface circuit 310 transmits the connection test signal TS1 and the test signals (e.g., DC_B, DC_R, . . . , ELVDD and ELVSS), which are output from the test signal generation circuit 320 and the compensation circuit 330, to the pad part 111, and transmits the feedback signal FS1 from the pad part 111 to the voltage sensing circuit 340. The interface circuit 310 may include a connector to connect the pad part 111 and the test circuit 130.

The test signal generation circuit 320 outputs the connection test signal TS1. The connection test signal TS1 is applied to the first connection test pad TCP1 of the pad part 111 through the interface circuit 310.

The voltage sensing circuit 340 senses the voltage level of the feedback signal FS1 provided thereto through the interface circuit 310 from the second connection test pad TCP2 of the pad part 111 and transmits a sensing voltage signal DV corresponding to the sensed voltage level to the compensation circuit 330.

The compensation circuit 330 adjusts the voltage level of the test signals (e.g., DC_B, DC_R, . . . , ELVDD, and ELVSS) to be applied to the test pads TP1 to TPk based on the connection test signal TS1 and the sensing voltage signal DV.

Referring to FIGS. 2 and 5, the connection test signal TS1 generated by the test signal generation circuit 320 is fed back as the feedback signal FS1 to the voltage sensing circuit 340 through the first connection test pad TCP1 of the connection part 110, the first connection pad CP1 of the display panel 200, the test signal line 221, the second connection pad CP2 of the display panel 200 and the second connection test pad TCP2 of the connection part 110.

The compensation circuit 330 may calculate a target voltage level based on the connection test signal TS1, the connection resistance between the first connection test pad TCP1 and the first connection pad CP1, a resistance of the test signal line 221, and the connection resistance between the second connection test pad TCP2 and the second connection pad CP2. The compensation circuit 330 may adjust the voltage level of the test signals (e.g., DC_B, DC_R, . . . , ELVDD, and ELVSS) depending on a difference between the target voltage level and the sensing voltage signal DV. In an exemplary embodiment, when the difference between the target voltage level and the sensing voltage signal DV is greater than a reference value, the voltage level of the test signals (e.g., DC_B, DC_R, . . . , ELVDD, and ELVSS) may increase by a predetermined rate.

As shown in FIG. 2, in a case where the first connection test pad TCP1 and the second connection test pad TCP2 of the connection part 110 are substantially fully connected to the first connection pad CP1 and the second connection pad CP2 of the display panel 200, the voltage level of the sensing voltage signal DV approaches the target voltage level. In this case, the voltage level of the test signals (e.g., DC_B, DC_R, . . . , ELVDD, and ELVSS) may not be adjusted.

As shown in FIGS. 3 and 4, in a case where the first connection test pad TCP1 and the second connection test pad TCP2 of the connection part 110 are not fully connected to the first connection pad CP1 and the second connection pad CP2 of the display panel 200, the voltage level of the sensing voltage signal DV may be lower than the target voltage level. In this case, the test circuit 130 increases the voltage level of the test signals (e.g., DC_B, DC_R, . . . , ELVDD, and ELVSS) by the predetermined rate. Accordingly, the distortion of the test signals, which is caused by the incomplete connection between the test pads TP1 to TPk and the pads P1 to Pk, may be effectively compensated.

Referring back to FIG. 5, the resistor VR is connected between an input terminal of the voltage sensing circuit 340, which receives the feedback signal FS1, and a ground voltage. In an exemplary embodiment, the resistor VR may be, but not limited to, a variable resistor. The voltage sensing circuit 340 outputs a resistance variable signal VRC to control or vary the resistance value of the resistor VR.

In a case where it is difficult to detect or predict the connection resistance between the first connection test pad TCP1 and the first connection pad CP1, the resistance of the test signal line 221, and the connection resistance between the second connection test pad TCP2 and the second connection pad CP2, the voltage sensing circuit 340 may vary the resistance value of the resistor VR depending on the voltage level of the feedback signal FS1 after setting the resistance value of the resistor VR to a predetermined level. Accordingly, the test signals (e.g., DC_B, DC_R, . . . , ELVDD, and ELVSS) may be accurately compensated in consideration of a connection error between the first connection test pad TCP1 and the first connection pad CP1 and the connection error between the second connection test pad TCP2 and the second connection pad CP2.

Figure 6:
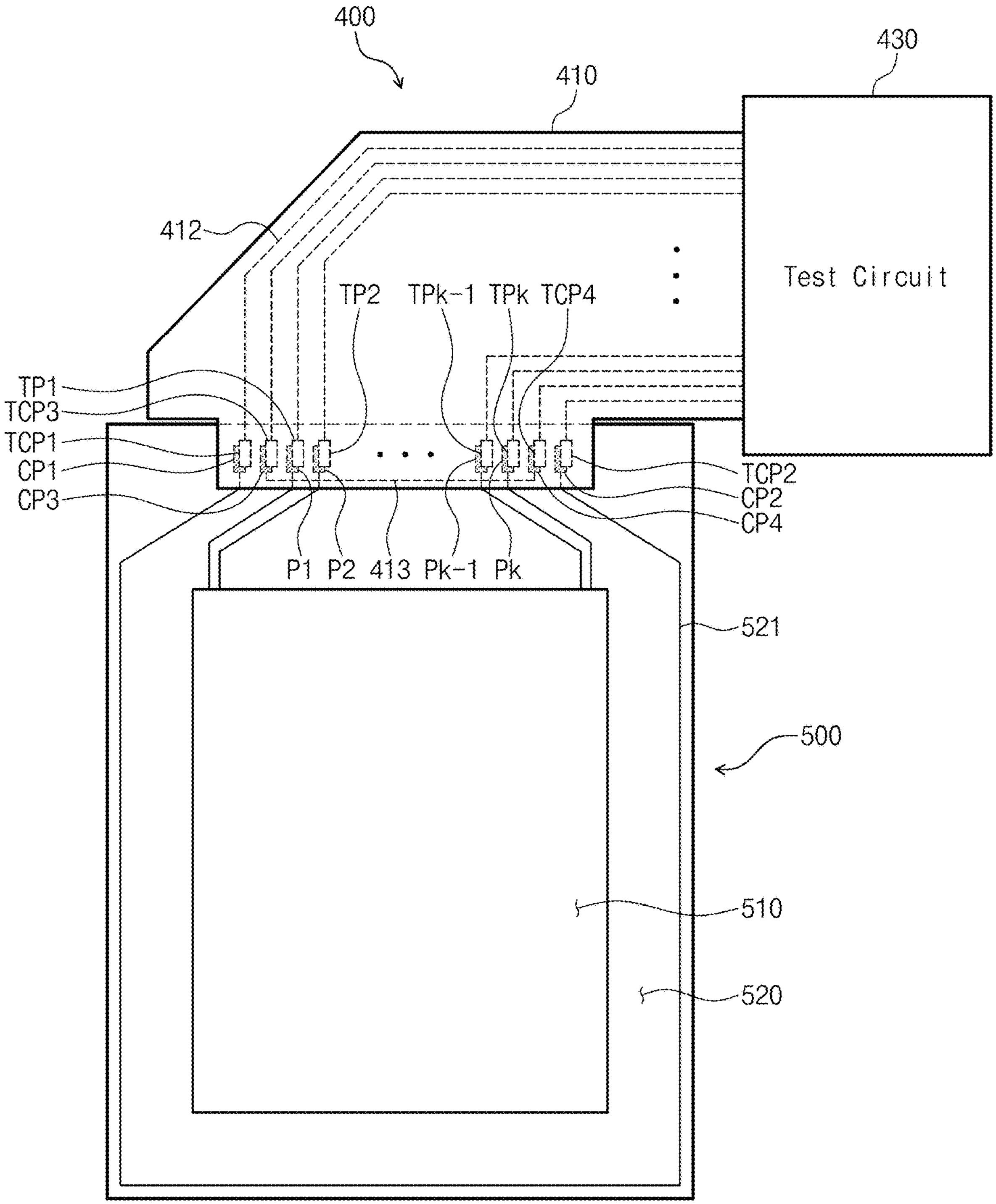
FIG. 6 is a view showing a lighting test device and a display panel in a connected state according to an alternative exemplary embodiment of the disclosure.

FIG. 6 is a view showing a lighting test device 400 and a display panel 500 in a connected state according to an alternative exemplary embodiment of the disclosure.

Referring to FIG. 6, in an exemplary embodiment, the connection part 410 may be implemented by a FPCB, on which a plurality of signal lines 412 is arranged, and the connection part 410 may include a pad part at one end thereof. In such an embodiment, a third connection test pad TCP3 and a fourth connection test pad TCP4 are further arranged in a lower portion of a connection part 410 of the lighting test device 400 in addition to a first connection test pad TCP1, a second connection test pad TCP2, and a plurality of test pads TP1 to TPk. The connection part 410 of the lighting test device 400 includes a second test signal line 413 that electrically connects the third connection test pad TCP3 and the fourth connection test pad TCP4.

The display panel 500 includes the display area 510 and the non-display area 520. The display panel 500 further includes a third connection pad CP3 and a fourth connection pad CP4 in addition to a first connection pad CP1, a second connection pad CP2, and a plurality of pads P1 to Pk in the non-display area 520.

The first to fourth connection test pads TCP1 to TCP4 of the connection part 410 are connected to the first to fourth connection pads CP1 to CP4 of the display panel 500, respectively. In such an embodiment, the test pads TP1 to TPk of the connection part 410 are connected to the pads P1 to Pk of the display panel 500, respectively.

A test circuit 430 transmits connection test signals to the first connection pad CP1 and the third connection pad CP3 and receives feedback signals from the second connection pad CP2 and the fourth connection pad CP4. The test circuit 430 compares voltage levels of the connection test signals with those of the feedback signals to adjust the voltage levels of the test signals to be applied to the test pads TP1 to TPk.

In an exemplary embodiment, a first test signal line 521 is arranged in the non-display area 520 of the display panel 500, and the second test signal line 413 is arranged on the connection part 410. The first test signal line 521 electrically connects the first connection pad CP1 and the second connection pad CP2.

In such an embodiment, when the connection test signals having the same voltage level are transmitted to the first connection pad CP1 and the third connection pad CP3, a difference in voltage level between the feedback signals from the second connection pad CP2 and the fourth connection pad CP4 may be substantially great. In this case, the occurrence of connection error is estimated between the pads of the connection part 410 and the pads of the display panel 500, and it is estimated that at least one of the connection part 410 and the display panel 500 is damaged, such that an analysis of the damage may be desired.

Figure 7:
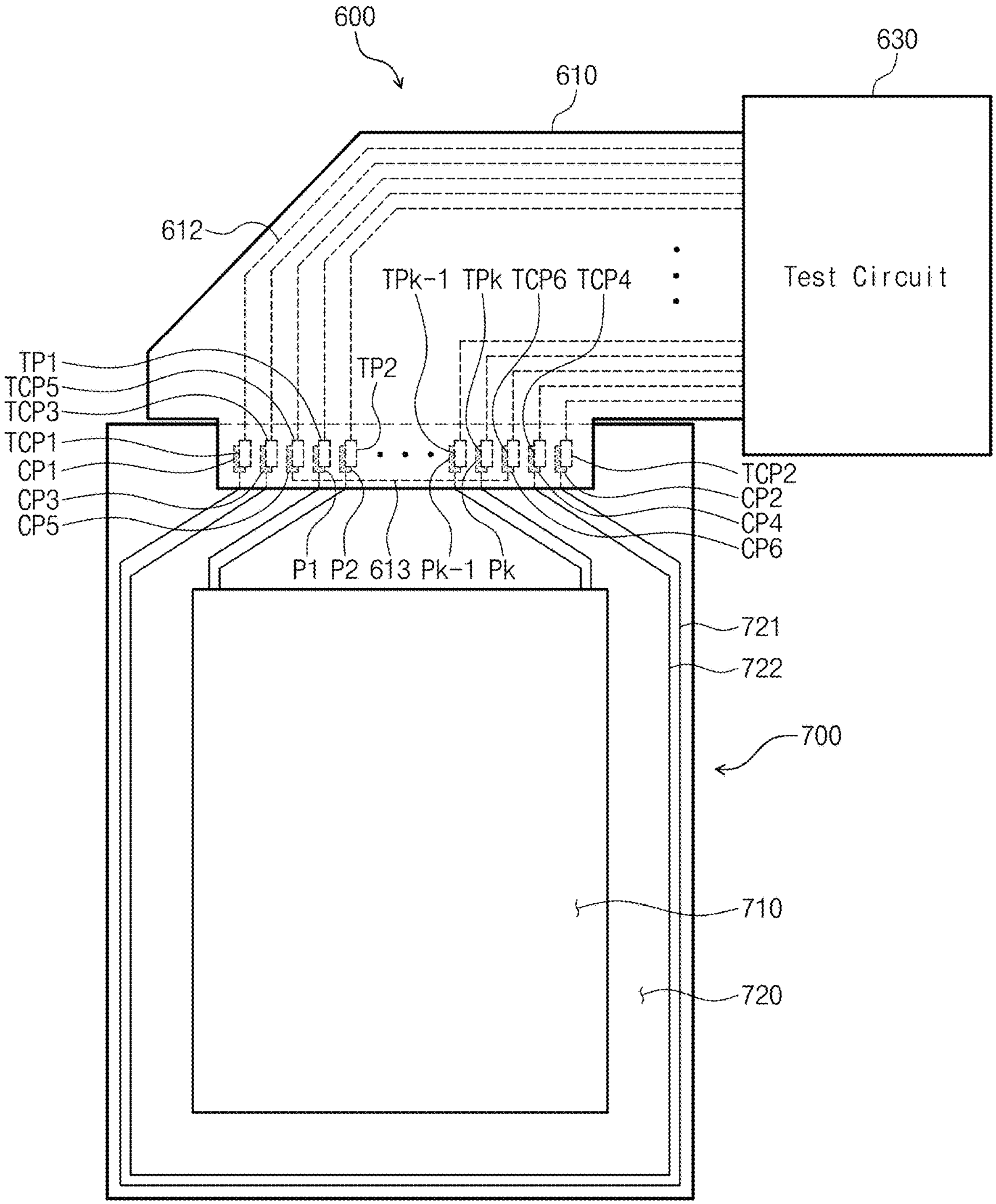
FIG. 7 is a view showing a lighting test device and a display panel in a connected state according to another alternative exemplary embodiment of the disclosure.

FIG. 7 is a view showing a lighting test device 600 and a display panel 700 in a connected state according to another alternative exemplary embodiment of the disclosure.

Referring to FIG. 7, in an exemplary embodiment, the connection part 610 may be implemented by a FPCB, on which a plurality of signal lines 612 is arranged, and the connection part 610 may include a pad part at one end thereof. In such an embodiment, first to sixth connection test pads TCP1 to TCP6 and a plurality of test pads TP1 to TPk are arranged in a lower portion of a connection part 610 of the lighting test device 600. The connection part 610 of the lighting test device 600 includes a third test signal line 613 that electrically connects the fifth connection test pad TCP5 and the sixth connection test pad TCP6.

The display panel 700 includes the display area 710 and the non-display area 720. The display panel 700 includes first to sixth connection pads CP1 to CP6 and a plurality of pads P1 to Pk in the non-display area 720.

The first to sixth connection test pads TCP1 to TCP6 of the connection part 610 are connected to the first to sixth connection pads CP1 to CP6 of the display panel 700, respectively. In such an embodiment, the test pads TP1 to TPk of the connection part 610 are connected to the pads P1 to Pk of the display panel 700, respectively.

A test circuit 630 transmits connection test signals to the first, third and fifth connection pads CP1, CP3 and CP5 and receives feedback signals from the second, fourth and sixth connection pads CP2, CP4 and CP6. The test circuit 630 compares voltage levels of the connection test signals with voltage levels of the feedback signals to adjust the voltage levels of the test signals to be applied to the test pads TP1 to TPk.

In an exemplary embodiment, test signal lines 721 and 722 are arranged in the non-display area 720 of the display panel 700. The test signal line 721 electrically connects the first connection pad CP1 and the second connection pad CP2. The test signal line 722 electrically connects the third connection pad CP3 and the fourth connection pad CP4. The third test signal line 613 is arranged in the lower portion of the connection part 610.

In such an embodiment, when the connection test signals having the same voltage level are transmitted to the first, third and fifth connection pads CP1, CP3 and CP5, a difference in voltage level between the feedback signals from the second, fourth and sixth connection pads CP2, CP4 and CP6 may be substantially great. In this case, the occurrence of connection error is estimated between the pads of the connection part 610 and the pads of the display panel 700, and it is estimated that at least one of the connection part 610 and the display panel 700 is damaged, such that an analysis of the damage may be desired.

In such an embodiment, the voltage levels of the test signals to be applied to the test pads TP1 to TPk may be adjusted depending on the tendency of the feedback signals provided from the second, fourth and sixth connection pads CP2, CP4 and CP6.

In an exemplary embodiment, when difference values between the voltage levels of the feedback signals provided from the second, fourth and sixth connection pads CP2, CP4 and CP6 and a reference value is great and the difference values are the same as each other, it may be determined that the connection error occurs between the pads of the connection part 610 and the pads of the display panel 700 rather than a defect of the connection part 610 and the display panel 700 itself.

Accordingly, in such an embodiment, the connection error may be precisely detected and the error may be accurately compensated.

Figure 8:
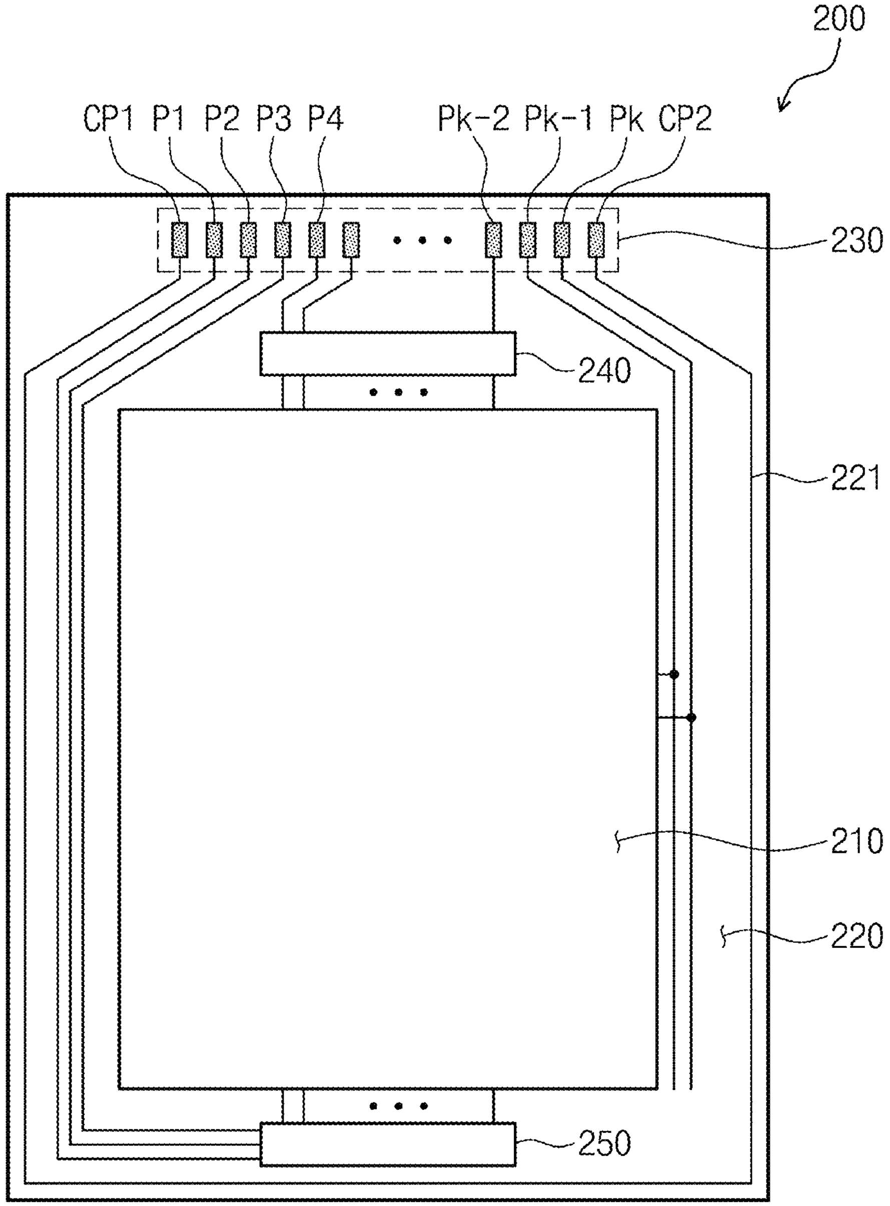
FIG. 8 is a view showing a display panel according to an exemplary embodiment of the disclosure.

FIG. 8 is a view showing the display panel 200 according to an exemplary embodiment of the disclosure.

Referring to FIG. 8, the display panel 200 according to an exemplary embodiment includes the display area 210 and the non-display area 220. The display panel 200 includes the display panel pad part 230, a first test circuit part 240, and a second test circuit part 250, which are arranged in the non-display area 220. The display panel pad part 230 connected to the pad part 111 of the connection part 110 shown in FIG. 1 is disposed at an end of the non-display area 220. The display panel pad part 230 includes the first connection pad CP1, the second connection pad CP2, and the pads P1 to Pk.

The first test circuit part 240 applies lighting test signals to the pixels arranged in the display area 210 in response to the test signals applied thereto through the pads P4 to Pk−2.

The second test circuit part 250 applies the lighting test signals to the pixels arranged in the display area 210 in response to the test signals applied thereto through the pads P1 to P3. The power supply voltages ELVDD and ELVSS provided from the pads Pk−1 and Pk are applied to the pixels in the display area 210.

Figure 9:
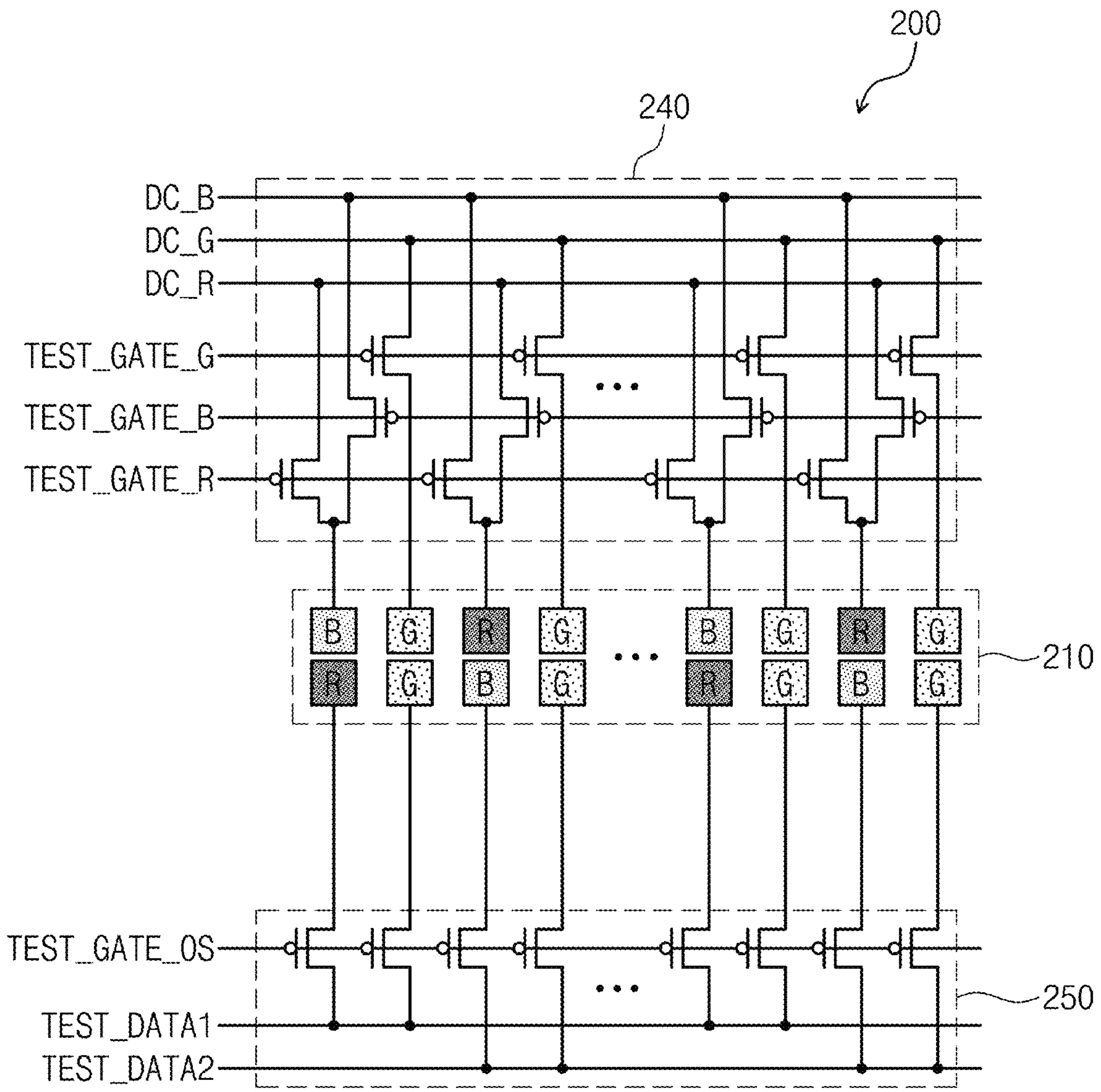
FIG. 9 is a view showing an exemplary embodiment of a display area, a first test circuit part and a second test circuit part shown in FIG. 8.

FIG. 9 is a view showing an exemplary embodiment of the display area 210, the first test circuit part 240 and the second test circuit part 250 shown in FIG. 8.

Referring to FIG. 9, in an exemplary embodiment, a red pixel R corresponding to a red color, a blue pixel B corresponding to a blue color, and a green pixel G corresponding to a green color are arranged in the display area 210. In an exemplary embodiment, the red pixel R, the blue pixel B and the green pixel G are arranged in the display area 210 in a pentile manner. In such an embodiment, the red pixel R and the blue pixel B are arranged in a pixel column, and the green pixel G is arranged in another pixel column.

The first test circuit part 240 includes a plurality of transistors. In an exemplary embodiment, the transistors of the first test circuit part 240 are p-type metal-oxide-semiconductor ("PMOS") transistors, but not being limited thereto. In an alternative exemplary embodiment, the transistors of the first test circuit part 240 may be n-type metal-oxide-semiconductor ("NMOS") transistors. The transistors of the first test circuit part 240 apply first test data signals DC_G, DC_B, and DC_R to corresponding pixel columns in the display area 210 in response to first test signals TEST_GATE_G, TEST_GATE_B and TEST_GATE_R.

The second test circuit part 250 includes a plurality of transistors. In an exemplary embodiment, the transistors of the second test circuit part 250 are PMOS transistors, but not being limited thereto. In an alternative exemplary embodiment, the transistors of the second test circuit part 250 may be NMOS transistors. The transistors of the second test circuit part 250 apply second test data signals TEST_DATA1 and TEST_DATA2 to corresponding pixel columns in the display area 210 in response to a second test signal TEST_GATE_OS.

In one exemplary embodiment, for example, the voltage level of each of the first test data signals DC_G, DC_B, and DC_R provided from the test circuit 130 of the lighting test device 100 shown in FIG. 1 is about zero (0) volts, and the voltage level of each of the second test data signals TEST_DATA1 and TEST_DATA2 is about 6 volts. In one exemplary embodiment, for example, the voltage level of each of the first test data signals DC_G, DC_B, and DC_R may be about 3 volts, and the voltage level of each of the second test data signals TEST_DATA1 and TEST_DATA2 is about 6 volts. In an alternative exemplary embodiment, voltage levels of the second test data signals TEST_DATA1 and TEST_DATA2 may be different from each other.

In an exemplary embodiment, when the lighting test with respect to the display panel 200 is completed by the lighting test device 100 shown in FIG. 1, the transistors of the first test circuit part 240 are maintained in an off state by the first test signals TEST_GATE_G, TEST_GATE_B, and TEST_GATE_R. In such an embodiment, when the lighting test is completed, the transistors of the second test circuit part 250 are maintained in the off state by the second test signal TEST_GATE_OS.

Figure 10:
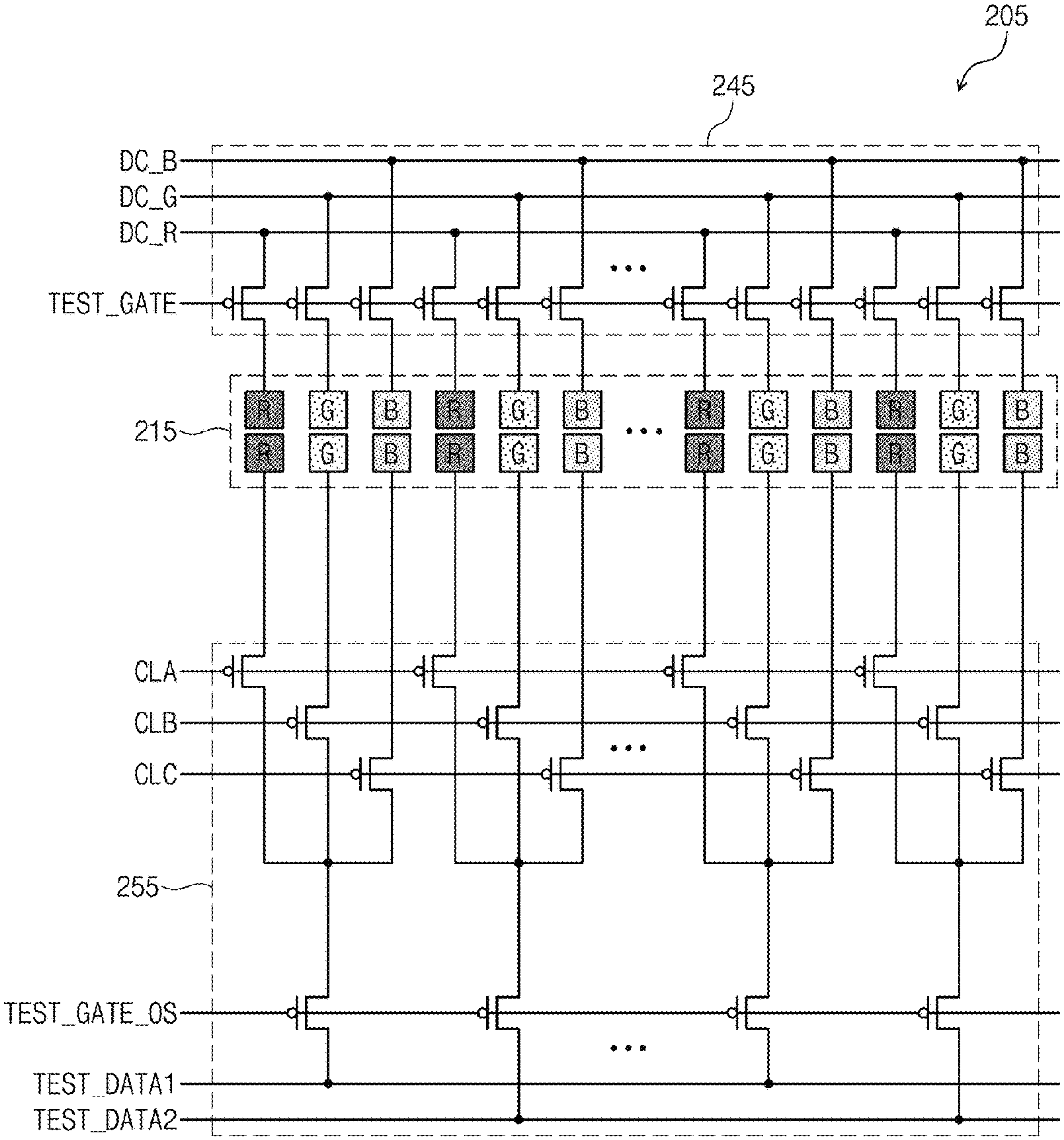
FIG. 10 is a view showing an alternative exemplary embodiment of a display area, a first test circuit part and a second test circuit part shown in FIG. 8.

FIG. 10 is a view showing an alternative exemplary embodiment of a display area, a first test circuit part and a second test circuit part shown in FIG. 8.

Referring to FIG. 10, in an exemplary embodiment, a red pixel R corresponding to a red color, a blue pixel B corresponding to a blue color, and a green pixel G corresponding to a green color are arranged in the display area 215. In an exemplary embodiment, the red pixel R, the blue pixel B, and the green pixel G are arranged in the display area 215 in a stripe manner. In such an embodiment, each of the red pixel R, the green pixel G, and the blue pixel B is arranged in a corresponding pixel column.

The first test circuit part 245 includes a plurality of transistors. In an exemplary embodiment, the transistors of the first test circuit part 245 are PMOS transistors, but not being limited thereto. In an alternative exemplary embodiment, the transistors of the first test circuit part 245 may be NMOS transistors. The transistors of the first test circuit part 245 apply first test data signals DC_B, DC_G, and DC_R to corresponding pixel columns in the display area 215 in response to a first test signal TEST_GATE.

The second test circuit part 255 includes a plurality of transistors. In an exemplary embodiment, the transistors of the second test circuit part 255 are PMOS transistors, but not being limited thereto. In an alternative exemplary embodiment, the transistors of the second test circuit part 255 may be NMOS transistors. The transistors of the second test circuit part 255 apply second test data signals TEST_DATA1 and TEST_DATA2 to corresponding pixel columns in the display area 215 in response to second test signals TEST_GATE_OS, CLA, CLB, and CLC.

In an exemplary embodiment, when the lighting test with respect to the display panel 200 is completed by the lighting test device 100 shown in FIG. 1, the transistors of the first test circuit part 245 are maintained in an off state by the first test signal TEST_GATE. In such an embodiment, when the lighting test is completed, the transistors of the second test circuit part 255 are maintained in the off state by the second test signals TEST_GATE_OS, CLA, CLB, and CLC.

Figure 11:
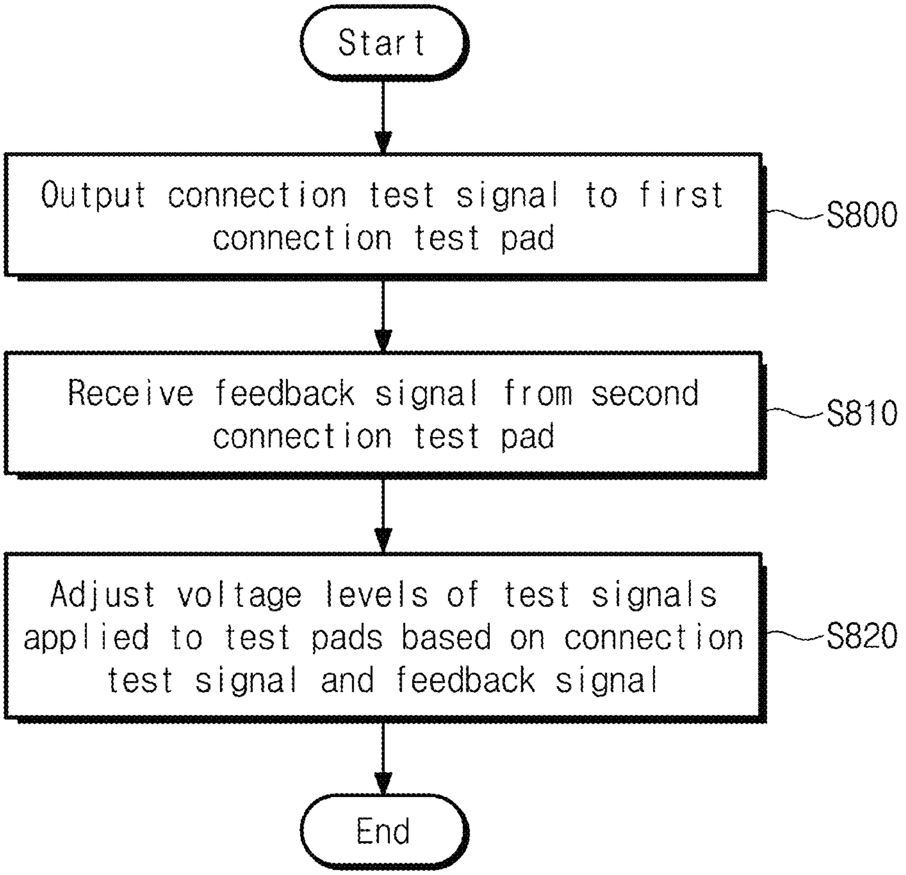
FIG. 11 is a flowchart showing an operation of a lighting test device according to an exemplary embodiment of the disclosure.

FIG. 11 is a flowchart showing an operation of a lighting test device according to an exemplary embodiment of the disclosure. For the convenience of description, the operation of the lighting test device will be described with reference to the lighting test device 100 shown in FIG. 2.

Referring to FIGS. 2 and 11, the test circuit 130 of the lighting test device 100 outputs the connection test signal to the first connection test pad TCP1 (S800). The connection test signal is applied to the second connection test pad TCP2 through the first connection test pad TCP1 of the connection part 110, the first connection pad CP1 of the display panel 200, the test signal line 221 and the second connection pad CP2.

The lighting test device 100 receives the feedback signal from the second connection test pad TCP2 (S810).

The lighting test device 100 adjusts the voltage level of the test signals to be applied to the test pads TP1 to TPk based on the connection test signal and the feedback signal (S820).

In an exemplary embodiment, as shown in FIGS. 3 and 4, in a case where the first connection test pad TCP1 and the second connection test pad TCP2 of the connection part 110 are not fully connected to the first connection pad CP1 and the second connection pad CP2 of the display panel 200, the voltage level of the sensing voltage signal DV may be lower than the target voltage level. In this case, the test circuit 130 increases the voltage level of the test signals (e.g., DC_B, DC_R, . . . , ELVDD, and ELVSS) by the predetermined rate. Accordingly, in such an embodiment, the distortion of the test signals, which is caused by the incomplete connection between the test pads TP1 to TPk and the pads P1 to Pk, may be effectively compensated.

What is claimed is:

1. A lighting test device for testing a lighting state of pixels of a display panel, the lighting test device comprising:

a connection part comprising a first connection test pad, a second connection test pad and a plurality of test pads, which are arranged at an end of the connection part, wherein the connection part is allowed to be connected to the display panel through the first connection test pad, the second connection test pad and the test pads; and a test circuit which outputs a connection test signal to a test signal line arranged in the display panel through the first connection test pad, receives a feedback signal through the second connection test pad from the test signal line, and adjusts voltage levels of test signals to be applied to the test pads based on the connection test signal and the feedback signal.

2. The lighting test device of claim 1, wherein the test circuit comprises:

a test signal generation circuit which generates the connection test signal;

a voltage sensing circuit which receives the feedback signal through the second connection test pad, senses a voltage level of the feedback signal, and outputs a sensing voltage signal based on the voltage level of the feedback signal; and a compensation circuit which adjusts the voltage levels of the test signals to be applied to the test pads based on the connection test signal and the sensing voltage signal.

3. The lighting test device of claim 2, wherein the test circuit further comprises a resistor connected between a signal line, which receives the feedback signal, and a ground voltage.

4. The lighting test device of claim 3, wherein the resistor is a variable resistor, and the voltage sensing circuit applies a resistance variable signal to the variable resistor to vary a resistance value of the variable resistor.

5. The lighting test device of claim 1, wherein the connection part further comprises a third connection test pad and a fourth connection test pad, which are to be connected to the display panel, and the test circuit further outputs another connection test signal to the third connection test pad, and further receives another feedback signal through the fourth connection test pad, wherein the test circuit adjusts the voltage levels of the test signals to be applied to the test pads based on the connection test signal, the another connection test signal, the feedback signal and the another feedback signal.

6. The lighting test device of claim 5, wherein the connection part further comprises a signal line arranged on the connection part to electrically connect the third connection test pad and the fourth connection test pad to each other.

7. The lighting test device of claim 5, wherein the test circuit increases the voltage levels of the test signals to be applied to the test pads by a predetermined rate when a difference in voltage between the connection test signal and the feedback signal and a difference in voltage between the another connection test signal and the another feedback signal are greater than a reference value.

8. The lighting test device of claim 1, wherein the connection part comprises a flexible printed circuit board.

9. A lighting test method performed by a lighting test device for testing a lighting state of pixels of a display panel, the lighting test device comprising a connection part having a first connection test pad, a second connection test pad, a plurality of test pads, and a test circuit, the lighting test method comprising:

outputting a connection test signal to a test signal line arranged in the display panel through the first connection test pad;

receiving a feedback signal through from the second connection test pad from the test signal line; and adjusting voltage levels of test signals to be applied to the test pads based on the connection test signal and the feedback signal.

10. The method of claim 9, wherein the lighting test device further comprises a resistor connected between a signal line, which receives the feedback signal, and a ground voltage.

11. The method of claim 10, further comprising:

varying a resistance value of the resistor, wherein the resistor is a variable resistor.

12. The method of claim 9, wherein the lighting test device further comprises a third connection test pad and a fourth connection test pad, and the method further comprises:

outputting another connection test signal to the third connection test pad; and receiving another feedback signal from the fourth connection test pad, wherein the adjusting the voltage levels of the test signals to be applied to the test pads comprises adjusting the voltage levels of the test signals to be applied to the test pads based on the connection test signal, the another connection test signal, the feedback signal and the another feedback signal.

13. The method of claim 12, wherein the adjusting the voltage levels of the test signals to be applied to the test pads comprises increasing the voltage levels of the test signals to be applied to the test pads by a predetermined rate when a difference in voltage between the connection test signal and the feedback signal and a difference in voltage between the another connection test signal and the another feedback signal are greater than a reference value.

14. A lighting test system comprising:

a display panel comprising a display area, in which a plurality of pixels is arranged, and a non-display area; and a lighting test device which tests a lighting state of the pixels of the display panel, wherein the lighting test device comprises:

a connection part comprising a first connection test pad, a second connection test pad, and a plurality of test pads, which are arranged at an end of the connection part, wherein the connection part is allowed to be connected to the display panel through the first connection test pad, the second connection test pad and the test pads; and a test circuit which outputs a connection test signal to the first connection test pad, receives a feedback signal through the second connection test pad, and adjusts voltage levels of test signals to be applied to the test pads based on the connection test signal and the feedback signal, wherein the display panel comprises:

a first connection pad, a second connection pad and a plurality of pads, which are arranged at an end of the non-display area and connected to the first connection test pad, the second connection test pad and the test pads, respectively; and a test signal line arranged in the non-display area to electrically connect the first connection pad and the second connection pad.

15. The lighting test system of claim 14, wherein the test signal line is disposed to surround the display area outside the display area.

16. The lighting test system of claim 14, wherein the test circuit comprises:

a test signal generation circuit which generates the connection test signal;

a voltage sensing circuit which receives the feedback signal through the second connection test pad, senses a voltage level of the feedback signal, and outputs a sensing voltage signal based on the voltage level of the feedback signal; and a compensation circuit which adjusts the voltage levels of the test signals to be applied to the test pads based on the connection test signal and the sensing voltage signal.

17. The lighting test system of claim 16, wherein the test circuit further comprises a resistor connected between a signal line, which receives the feedback signal, and a ground voltage.

18. The lighting test system of claim 17, wherein
the resistor is a variable resistor, and
the voltage sensing circuit applies a resistance variable signal to the variable resistor to vary a resistance value of the variable resistor.

19. The lighting test system of claim 14, wherein
the connection part further comprises a third connection test pad and a fourth connection test pad, which are to be connected to the display panel, and
the test circuit outputs another connection test signal to the third connection test pad, and receives another feedback signal through the fourth connection test pad,
wherein the test circuit adjusts the voltage levels of the test signals to be applied to the test pads based on the connection test signal, the another connection test signal, the feedback signal and the another feedback signal.

20. The lighting test system of claim 19, wherein the connection part further comprises a signal line arranged on the connection part to electrically connect the third connection test pad and the fourth connection test pad.

* * * * *